United States Patent [19]

Yoshida et al.

[11] Patent Number: 5,334,252
[45] Date of Patent: Aug. 2, 1994

[54] METHOD OF AND APPARATUS FOR PREPARING OXIDE SUPERCONDUCTING FILM

[75] Inventors: Noriyuki Yoshida; Satoshi Takano; Shigeru Okuda; Noriki Hayashi, all of Osaka; Tsukushi Hara, Chofu; Kiyoshi Okaniwa, Chofu; Takahiko Yamamoto, Chofu, all of Japan

[73] Assignee: Sumimoto Electric Industries, Ltd., Osaka, Japan

[21] Appl. No.: 952,928

[22] Filed: Sep. 25, 1992

Related U.S. Application Data

[62] Division of Ser. No. 662,874, Mar. 1, 1991, Pat. No. 5,187,148.

[30] Foreign Application Priority Data

| Mar. 2, 1990 [JP] | Japan | 2-52522 |
| Mar. 2, 1990 [JP] | Japan | 2-52523 |
| Mar. 2, 1990 [JP] | Japan | 2-52524 |
| Feb. 15, 1991 [JP] | Japan | 3-30403 |

[51] Int. Cl.$^5$ .............................. C23C 14/00
[52] U.S. Cl. .................... 118/726; 118/715; 505/732; 505/474; 505/950
[58] Field of Search ............. 118/715, 726; 505/1, 505/732

[56] References Cited

PUBLICATIONS

Webster's New Collegiate Dictionary, G&C Merriam Co, ©1975, pp. 1235 and 1304.

Roas, Epitaxial Growth of $YBa_2Cu_3O_{7-x}$ Thin Films by a Laser Evaporation Process, Appl. Phys. Lett. 53(16), Oct. 17, 1988, pp. 1557-1559.

Greer, In-Situ Growth of $YBa_2Cu_3O_{7-x}$ Thin Films on Three-Inch Wafers Using Laser-Ablation and an Atomic Oxygen Source, Proceedings of the 3rd Annual Conference on Superconductivity and Applications, Buffalo, N.Y., Sep. 1989.

Muenchausen, Effects of Beam Parameters on Eximer Laser Deposition of $YBa_2Cu_3O_{7-x}$, Appl. Phys Lett. 56(6), Feb. 1990, pp. 578-580.

*Primary Examiner*—Richard Bueker
*Attorney, Agent, or Firm*—Pennie & Edmonds

[57] ABSTRACT

In order to enable formation of a smooth and dense oxide superconducting film with no clear appearance of grain boundaries in a fine structure even at a high film forming rate, a laser ablation method is employed to apply a laser beam 2 to a target 1 containing components of an oxide superconductive material and deposit particles, which are thus scattered from the target 1, on a substrate 3, while gaseous oxygen is supplied from a gaseous oxygen inlet 7 toward laser plasma 6, which is generated by the application of the laser beam 2.

4 Claims, 3 Drawing Sheets

(a)    (b)

⊢⊣
1μm

METHOD OF AND APPARATUS FOR PREPARING OXIDE SUPERCONDUCTING FILM

This is a division of application Ser. No. 07/662,874, filed Mar. 1, 1991, now U.S. Pat. No. 5,187,148.

BACKGROUND OF THE INVENTION

1. Field of the Invention

The present invention relates to a method of and an apparatus for preparing an oxide superconducting film using laser ablation.

2. Description of the Background Art

Formation of an oxide superconducting film by excimer laser ablation, for example, is watched with interest in the point that it is possible to implement a high-quality film. In general, a pulse laser beam is employed for such laser ablation.

In an already reported method of preparing an oxide superconducting film using laser ablation, a high-quality oxide superconducting film is obtained when the laser beam is set at a repetition rate of not more than about 10 Hz so that the film forming rate is less than about 2000 Å/min.

When an oxide superconducting film is formed by ordinary laser ablation, the laser repetition rate is so increased as to increase the film forming rate. However, if the film forming rate is increased in excess of 2000 Å/min., for example, the as-formed oxide superconducting film is obtained as an aggregate of fine crystal grains of not more than 1 μm in size, and its critical temperature and critical current density are reduced in response to clear appearance of grain boundaries.

In a method of preparing an oxide superconducting film using ordinary laser ablation, it is necessary to heat a substrate to a temperature of at least 600° C., in order to facilitate crystallization of the oxide superconducting film, which is deposited on the substrate. Therefore, available materials for such a substrate are restricted to ceramic materials, single-crystalline materials of MgO, SrTiO₃ and the like, which are still unreactive with film components at such a high temperature, and it is impossible to use a substrate of a metal, for example.

SUMMARY OF THE INVENTION

Accordingly, an object of the present invention is to provide a method of and an apparatus for preparing an oxide superconducting film, which can obtain a smooth and dense oxide superconducting film in a fine structure with no distinct grain boundaries even in high-speed film formation.

Another object of the present invention is to provide a method of preparing an oxide superconducting film, which can form an oxide superconducting film still exhibiting excellent properties on a substrate of a relatively low temperature.

The present invention is first directed to a method of preparing an oxide superconducting film using laser ablation, which comprises the steps of applying a laser beam to a target containing components of an oxide superconductive material and depositing particles, being scattered from the target by such application of the laser beam, on a substrate. In order to solve the aforementioned technical problem, the inventive method is characterized in that gaseous oxygen is supplied toward laser plasma, which is generated by application of the laser beam.

Preferably the laser plasma is enclosed with a tubular member.

According to the present invention, the film forming rate for the oxide superconducting film is preferably selected to be at least 2000 Å/min.

According to the present invention, further, the gaseous oxygen, which is supplied toward the laser plasma, is preferably sprayed onto a portion close to a position, which is irradiated with the laser beam, on the target.

In the present invention, an electrode may be provided between the target and the substrate, thereby generating discharge plasma around the electrode. In this case, the substrate may be set at a temperature of less than 600° C.

The present invention is also directed to an apparatus for preparing an oxide superconducting film using laser ablation, which comprises a target containing components of an oxide superconductive material, a laser source for applying a laser beam to the target, and a substrate arranged to be opposite to the target. In order to solve the aforementioned technical problem, the inventive apparatus comprises a gaseous oxygen inlet for supplying gaseous oxygen toward laser plasma, which is generated by application of the laser beam.

The gaseous oxygen inlet may be provided on a forward end of a conduit, or, if a tubular member is arranged to enclose the laser plasma, such a gaseous oxygen inlet may be formed on an inner peripheral surface of the tubular member. In the latter case, a wall forming the tubular member may have a hollow structure defining a cavity. In this case, gaseous oxygen may be introduced into the cavity, while the gaseous oxygen inlet may be defined by a plurality of holes provided on the inner peripheral surface of the tubular member to communicate with the cavity.

When the gaseous oxygen is supplied toward the laser plasma, large quantities of atoms and/or molecules of oxygen excited species and/or oxide excited species are produced by reaction between the gaseous oxygen and the laser plasma. These excited species are essential to formation of a high-quality oxide superconducting film, and it is conceivable that a high-quality oxide superconducting film can be still implemented at a high film forming rate due to formation of large quantities of such excited species.

Thus, according to the present invention, gaseous oxygen is supplied to laser plasma, whereby a smooth and dense oxide superconducting film is obtained with no distinct grain boundaries in a fine structure. Consequently, it is possible to improve superconductive properties such as a critical temperature and critical current density.

The present invention has a remarkable effect particularly when the film forming rate is at least 2000 Å/min. If the film forming rate is set at such a high value of at least 2000 Å/min. in ordinary laser ablation, the as-formed oxide superconducting film is obtained as an aggregate of fine crystal grains of not more than 1 μm in size, to develop distinct grain boundaries as described above. According to the present invention, on the other hand, a smooth and dense film can be formed with no distinct grain boundaries even if such a high film forming rate of at least 2000 Å/min. is employed, and it is possible to substantially maintain excellent superconductive properties, which have been attained at a film forming rate of less than 2000 Å/min.

Thus, the present invention, which can effectively improve the quality of an oxide superconducting film formed at a high speed, is particularly effective when the same is applied to preparation of an oxide superconducting wire, which is obtained by employing a long tape-type substrate and continuously forming an oxide superconducting film thereon.

When a tubular member is arranged to enclose the laser plasma, it is possible to prevent diffusion of atoms and/or molecules of oxygen excited species and/or oxide excited species produced by reaction between the gaseous oxygen and the laser plasma, thereby providing such excited species in the laser plasma in high density. This further contributes to improvement of the quality of the oxide superconducting film, which is formed at a high speed.

According to the present invention, preferably, gaseous oxygen is sprayed onto a portion around a position, which is irradiated with the laser beam, on the target, to produce large quantities of oxygen excited species, while discharge plasma is generated to further increase the density of such oxygen excited species. Since such high density of excited species facilitate crystallization of the oxide superconducting film, it is possible to obtain a smooth and dense oxide superconducting film with no distinct grain boundaries even if the substrate temperature is not so much increased. Thus, it is possible to obtain an oxide superconducting film, which has excellent superconductive properties such as a high critical temperature and high critical current density.

In the aforementioned case, a high-quality oxide superconducting film can be obtained even if the substrate temperature is less than 600° C. Thus, it is possible to use a substrate of a metal, such as stainless steel or nickel, which is easily oxidized at a temperature exceeding 600° C. and considerably reactive with the film components, with no problem. A substrate of such a metal is advantageous in the point that the same can be easily elongated, and is flexible.

Thus, according to the present invention, it is possible to obtain a high-quality oxide superconducting film at a high film forming rate through a low-temperature process. Therefore, the present invention is particularly effective when a long flexible tape-type base material is employed as a substrate and an oxide superconducting film must be continuously formed on the tape-type base material along the longitudinal direction by laser ablation.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
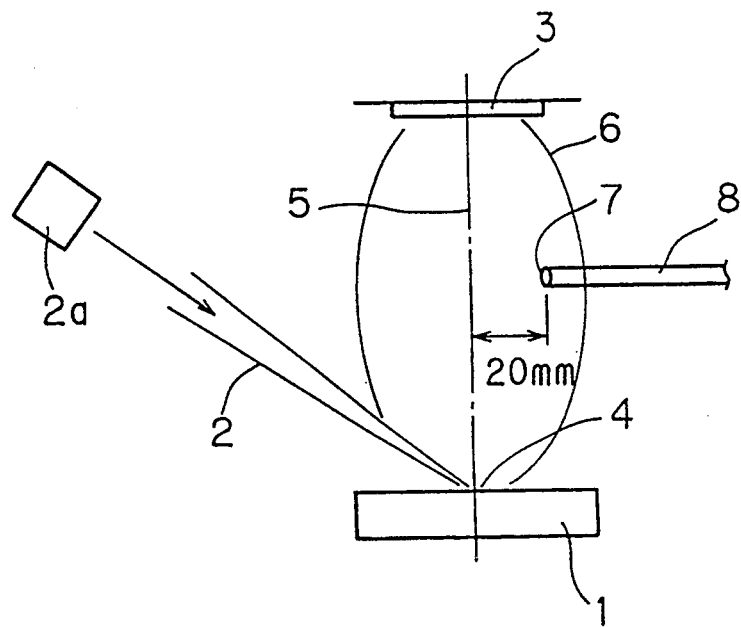
FIG. 1 is a front elevational view illustrating a state of carrying out an embodiment of the present invention.

FIG. 1 shows an embodiment of the inventive apparatus for preparing an oxide superconducting film.

A laser source 2a, such as an excimer laser, for example, applies a laser beam 2 to a target 1, which contains components of an oxide superconductive material. A substrate 3 is arranged to be opposite to the target 1.

When the laser beam 2 is applied onto the target 1, particles are scattered from the target 1 in states of atoms and/or molecules, about a normal 5 drawn on a spot 4, which is irradiated with the laser beam 2, on the target 1, to generate laser plasma 6. In order to supply gaseous oxygen toward the laser plasma 6, a gaseous oxygen inlet 7 is provided on a forward end of a conduit 8. In this embodiment, the gaseous oxygen inlet 7 is located at an intermediate point of a space between the target 1 and the substrate 3.

Figure 2:
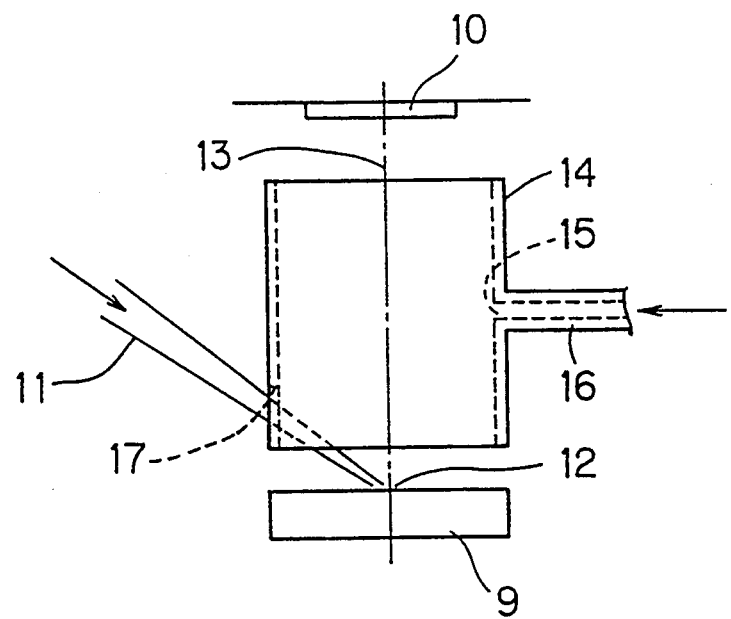
FIG. 2 is a front elevational view illustrating a state of carrying out another embodiment of the present invention.

FIG. 2 shows another embodiment of the inventive apparatus for preparing an oxide superconducting film.

Similarly to the embodiment shown in FIG. 1, this apparatus comprises a target 9 and a substrate 10, and a laser beam 11 is applied to the target 9.

A tubular member 14 of a cylindrical form, for example, is arranged about a normal 13 drawn about a spot 12, which is irradiated with the laser beam 11, on the target 9. A gaseous oxygen inlet 15 is formed on an inner peripheral surface of the tubular member 14, to blow out gaseous oxygen which is introduced therein through a conduit 16. In this embodiment, the gaseous oxygen inlet 15 is located at a substantially intermediate position along the axial length of the tubular member 14.

The tubular member 14 is provided with a notch 17 at need, not to block the laser beam 11.

Figure 3:
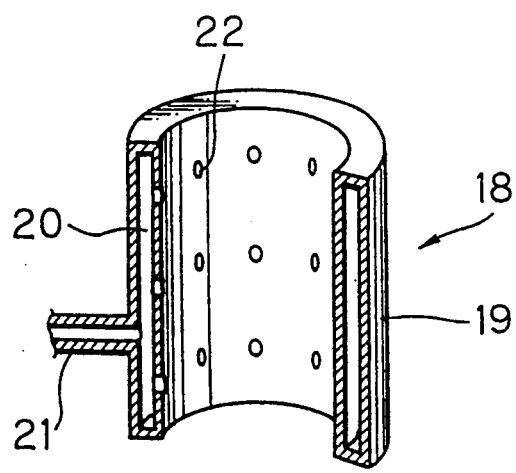
FIG. 3 is a fragmented perspective view independently showing a tubular member 18 which is employed in place of a tubular member 14 shown in FIG. 2.

FIG. 3 shows a tubular member 18, which can be substituted for the tubular member 14 in the apparatus shown in FIG. 2.

A wall 19 forming the tubular member 18 has a hollow structure defining a cavity 20. Gaseous oxygen is introduced into the cavity 20 through a conduit 21. A plurality of gaseous oxygen inlets 22 are formed on the inner peripheral surface of the tubular member 18. These gaseous oxygen inlets 22 are defined by holes, which are provided on the inner peripheral surface of the tubular member 18 to communicate with the cavity 20.

The gaseous oxygen inlets 22 may be equally or unequally distributed on the inner peripheral surface of the tubular member 18.

When the inventive apparatus is provided with the tubular member 14 as shown in FIG. 2, for example, the gaseous oxygen inlet 15 may not be formed on its inner peripheral surface, but an independent conduit may be inserted in the tubular member 14 so that a gaseous oxygen inlet provided on its forward end is located in the tubular member 14.

Experimental Examples carried out on the basis of the embodiments shown in FIGS. 1 to 3 are now described.

EXPERIMENTAL EXAMPLE 1

As shown in FIG. 1, a gaseous oxygen inlet 7 was provided at an intermediate point of a space between a target 1 and a substrate 3, which were arranged in parallel with each other, in a position separated by 20 mm from a normal 5, and gaseous oxygen of 300 SCCM was fed from the gaseous oxygen inlet 7, while the atmosphere pressure was set at 200 mTorr.

A $Y_1Ba_2Cu_3O_{7-\delta}$ sintered body was employed as a target 1. A KrF excimer laser beam 2 (wavelength: 248 run) was converged in 2 mm × 5 mm on the target 1. An MgO substrate 3 was employed, and its temperature was set at 700° C.

As shown in Table 1, the repetition rate (Hz) of the laser beam 2 was varied in a range of 10, 20, 30, 40 and 50, to measure film forming rates (Å/min.), critical current density values $J_c$ (A/cm$^2$) at 77.3 K and zero-resistance critical temperatures $T_c$ (K) in the respective cases. Table 1 shows the results. For the purpose of comparison, another film was formed with provision of no gaseous oxygen inlet, under an atmosphere of similar gaseous oxygen flow rate/pressure conditions. Table 1 also shows the results.

TABLE 1

| | Repetition Rate | 10 | 20 | 30 | 40 | 50 |
|---|---|---|---|---|---|---|
| | Film Forming Rate | 640 | 1220 | 1990 | 2600 | 3120 |
| With Oxygen Inlet | Jc | 3.5 × 10$^6$ | 2.5 × 10$^6$ | 1.7 × 10$^6$ | 1.6 × 10$^6$ | 1.8 × 10$^6$ |
| | Tc | 88.2 | 88.0 | 89.0 | 87.6 | 88.2 |
| With No Oxygen Inlet | Film Forming Rate | 620 | 1290 | 2010 | 2680 | 3050 |
| | Jc | 3.2 × 10$^6$ | 1.9 × 10$^6$ | 2.3 × 10$^5$ | — | — |
| | Tc | 89.2 | 86.3 | 83.0 | 72.3 | 70.2 |

It is understood from Table 1 that the film formed with provision of the gaseous oxygen inlet still maintains relatively excellent superconductive properties even if the film forming rate exceeds 2000 Å/min. In the film formed with provision of no gaseous oxygen inlet, on the other hand, superconductive properties are reduced as the film forming rate is increased.

EXPERIMENTAL EXAMPLE 2

A tubular member 14 of 5 mm in inner diameter, 60 mm in outer diameter and 30 mm in length was employed as shown in FIG. 2, to supply gaseous oxygen from a gaseous oxygen inlet 15 under conditions similar to those in Experimental Example 1. Other conditions were similar to those in Experimental Example 1.

The repetition rate (Hz) of the laser beam 11 was varied similarly to Experimental Example 1, to measure film forming rates (Å/min.), critical current density values $J_c$ (A/cm$^2$) and critical temperatures $T_c$ (K). Table 2 shows the results.

TABLE 2

| Repetition Rate | 10 | 20 | 30 | 40 | 50 |
|---|---|---|---|---|---|
| Film Forming Rate | 720 | 1350 | 2030 | 2710 | 3050 |
| Jc | 3.2 × 10$^6$ | 2.8 × 10$^6$ | 1.9 × 10$^6$ | 2.1 × 10$^6$ | 2.0 × 10$^6$ |
| Tc | 89.2 | 88.6 | 87.8 | 87.5 | 88.1 |

It is understood from Table 2 that the film maintains excellent superconductive properties even if the film forming rate is increased. Comparing the results with those of Experimental Example 1, the superconductive properties are slightly improved due to provision of the tubular member 14, particularly at film forming rates in excess of 2000 Å/min.

EXPERIMENTAL EXAMPLE 3

The tubular member 18 shown in FIG. 3 was substituted for the tubular member 14 in the apparatus shown in FIG. 2. This tubular member 18 was 50 mm in inner diameter, 60 mm in outer diameter and 30 mm in length. Gaseous oxygen of 300 SCCM was fed to a conduit 21, while the atmosphere pressure was set at 200 mTorr by adjusting exhaust gas.

In such Experimental Example 3, the laser repetition rate was set at 200 Hz, to enable a considerably high film forming rate.

Other conditions were similar to those in Experimental Example 1.

It was recognized from the as-formed oxide superconducting film that the film forming rate was 3.7 μm/min. This film exhibited a critical temperature of 88 K, and critical current density of 1.8 × 10$^6$ A/cm$^2$ at 77.3 K.

For the purpose of comparison, the tubular member 18 was removed and another film was formed in an oxygen atmosphere of 200 mTorr. It was recognized from the asformed oxide superconducting film that the film forming rate was 3.8 μm/min. This film exhibited a critical temperature of 27 K, and hence it was impossible to measure critical current density at 77.3 K.

EXPERIMENTAL EXAMPLE 4

The apparatus shown in FIG. 2 was applied to form a film, with the same tubular member 14 as that of Experimental Example 2. Gaseous oxygen of 200 SCCM was supplied from a gaseous oxygen inlet 15 of the tubular member 14.

A $Y_1Ba_2Cu_3O_{7-\delta}$ sintered body was employed as a target 9. An ArF excimer laser beam 11 (wavelength: 193 nm) was employed to form an irradiation spot 12 of 4 × 8 mm$^2$ on the target 9. In this case, energy density at the irradiation spot 12 of the target 9 was 1.2 J/cm$^2$. An MgO single-crystalline substrate 10 was employed and its temperature was set at 600° C.

The repetition rate of the laser beam 11 was set at 100 Hz, to form a film under a film forming rate of 0.8 μm/min.

The as-formed oxide superconducting film exhibited a critical temperature of 89.3 K, and critical current density of 1.7 × 10$^6$ Å/cm$^2$ at the liquid nitrogen temperature.

Figure 4:
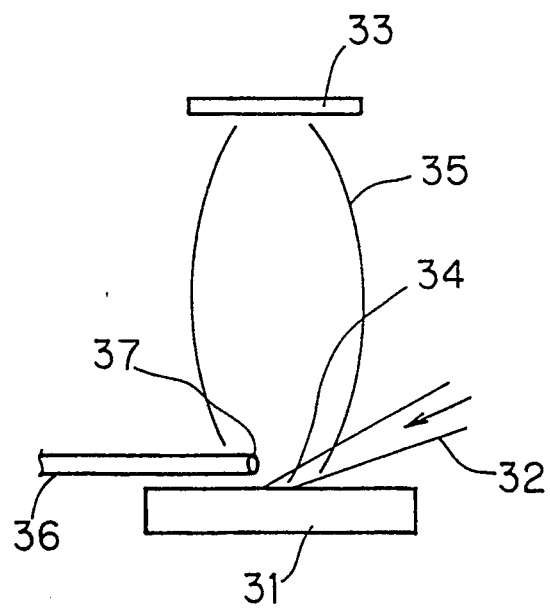
FIG. 4 is a front elevational view illustrating a state of carrying out still another embodiment of the present invention.

FIG. 4 shows a state of carrying out still another embodiment of the present invention.

A laser beam 32 is applied to a target 31, which contains components of an oxide superconductive material. A substrate 33 is arranged to be opposite to the target 31. When the laser beam 32 is applied to the target 31, particles are scattered in states of atoms and/or molecules from a position 34, which is irradiated with the laser beam 32, on the target 31. On the basis of such scattering of the particles, laser plasma 35 is generated from the irradiated position 34 toward the substrate 33.

A gaseous oxygen conduit 36 is provided in the vicinity of the target 31 to spray gaseous oxygen around the position 34, irradiated with the laser beam 32, of the target 31, and a gaseous oxygen supply port 37, which is provided on a forward end of the gaseous oxygen conduit 36, is located in the vicinity of the irradiated position 34.

Experimental Examples carried out on the basis of the embodiment shown in FIG. 4 are now described.

EXPERIMENTAL EXAMPLE 5

A $Y_1Ba_2Cu_3O_{7-\delta}$ sintered body was employed as a target 31. A KrF excimer laser beam 32 (wavelength: 248 nm) was converged to form a spot of 2 mm × 5 mm on the target 31. Energy density of the laser beam 32 on an irradiated position 34 of the target 31 was 2.5 J/cm². An MgO single-crystalline substrate 3 was employed and its temperature was set at 700° C.

First, a film was formed on the substrate 33 at a repetition rate of the laser beam 32 of 200 Hz, with no introduction of gaseous oxygen from the gaseous oxygen supply port 37. The film was formed in an atmosphere with an oxygen pressure of 200 mTorr.

Figure 5:
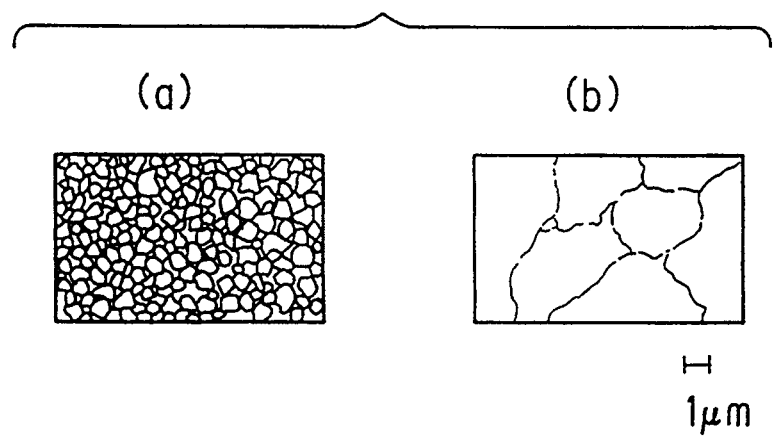
FIG. 5 illustrates surface states of oxide superconducting films which are prepared by a conventional laser ablation method and the embodiment shown in FIG. 4 at (a) and (b) respectively in an enlarged manner.

The as-formed oxide superconducting film, which was obtained at a film forming rate of 4 μm/min., exhibited a critical temperature of 25 K. No critical current density was measured since it was impossible to measure the same at 77.3 K. FIG. 5(a) shows the surface of this oxide superconducting film in an enlarged manner. As shown in FIG. 5(a), the oxide superconducting film was obtained as an aggregate of fine crystal grains of not more than 1 μm, with clear appearance of grain boundaries.

Then, a gaseous oxygen conduit 36 of a metal tube having an inner diameter of 2 mm was arranged to locate its gaseous oxygen supply port 37 at a position separated by 1 mm from the irradiated position 34. Gaseous oxygen of 300 SCCM was blown out from the gaseous oxygen supply port 37, and the atmosphere pressure was set at 200 mTorr, identically to the aforementioned comparative example.

The as-formed oxide superconducting film, which was obtained at a film forming rate of 4.2 μm/min., exhibited a critical temperature of 89 K, and critical current density of $1.7 \times 10^6$ Å/cm² at 77.3 K. FIG. 5(b) shows the surface of this superconducting film in an enlarged manner. As shown in FIG. 5(b), the surface was smoothed and densified, and connection between the crystal grains was increased. Although FIG. 5(b) shows apparent grain boundaries in virtual lines for the purpose of illustration, substantially no such lines were recognized in actual observation.

EXPERIMENTAL EXAMPLE 6

The pulse repetition rate (Hz) of the laser beam 32 was varied in a range of 10, 20, 30, 40 and 50, to form oxide superconducting films with and without introduction of gaseous oxygen respectively. Table 3 shows film forming rates (Å/min.), critical current density values $J_c$ (Å/cm²) at 77.3 K, and zero-resistance critical temperatures $T_c$ (K) of the oxide superconducting films measured in the aforementioned conditions. Other conditions were similar to those in Experimental Example 5.

TABLE 3

| Repetition Rate | | 10 | 20 | 30 | 40 | 50 |
| --- | --- | --- | --- | --- | --- | --- |
| With Introduction of Oxygen | Film Forming Rate | 720 | 1530 | 2310 | 3050 | 3800 |
| | $J_c$ | $3.8 \times 10^6$ | $2.9 \times 10^6$ | $2.8 \times 10^6$ | $3.1 \times 10^6$ | $2.3 \times 10^6$ |
| | $T_c$ | 88.6 | 88.3 | 89.3 | 87.9 | 89.8 |
| With No Introduction of Oxygen | Film Forming Rate | 620 | 1290 | 2010 | 2680 | 3050 |
| | $J_c$ | $3.2 \times 10^6$ | $1.9 \times 10^6$ | $2.3 \times 10^5$ | — | — |
| | $T_c$ | 89.2 | 86.2 | 83.0 | 72.3 | 70.2 |

It is understood from Table 3 that superconductive properties attained at film forming rates of less than 2000 Å/min. are still substantially maintained at film forming rates exceeding 2000 Å/min., due to introduction of gaseous oxygen. When no gaseous oxygen is introduced, on the other hand, superconductive properties are reduced as the film forming rate is increased. Comparing the films particularly in relation to the film forming rates in excess of 2000 Å/min., it is understood that the oxide superconducting film obtained according to the inventive method exhibits superior superconductive properties as compared with the oxide superconducting film obtained with no introduction of gaseous oxygen. Thus, the present invention has a remarkable effect particularly under a high film forming rate.

EXPERIMENTAL EXAMPLE 7

A $Y_1Ba_2Cu_3O_{7-\delta}$ sintered body was employed as a target 31. An ArF excimer laser beam 32 (wavelength: 193 nm) was converged to form a spot of 4 × 8 mm² on the target 31. Energy density at an irradiated position 34 of the target 31 was 1.2 J/cm². An MgO single-crystalline substrate 33 was employed, and its temperature was set at 600° C.

First, oxygen was introduced from a wall of a film forming chamber with no introduction of gaseous oxygen from the gaseous oxygen supply port 37, and the overall film forming chamber was brought into an oxygen pressure state of 150 mTorr, to form a film on the substrate 33 at a laser repetition rate of 200 Hz.

The as-formed oxide superconducting film, which was obtained at a film forming rate of 2.2 μm/min., exhibited a critical temperature of 18 K.

Then, a gaseous oxygen conduit 36 of a metal tube having an inner diameter of 2 mm was arranged to locate its gaseous oxygen supply port 37 at a position separated by 0.5 mm from an irradiated position 34, and gaseous oxygen of 200 SCCM was supplied from the gaseous oxygen supply port 37, to form a film under an atmosphere pressure of 150 mTorr, identically to the above comparative example.

The repetition rate of a laser beam 32 was set at 200 Hz, identically to the above comparative example. The asformed oxide superconducting film, which was obtained at a film forming rate of 2.7 μm/min., exhibited a critical temperature of 90 K, and critical current density of $1.9 \times 10^6$ Å/cm² at 77.3 K.

Figure 6:
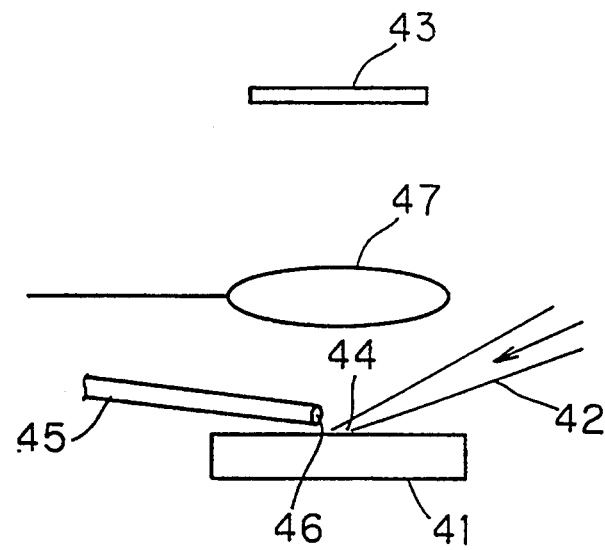
FIG. 6 is a front elevational view illustrating a state of carrying out a further embodiment of the present invention.

FIG. 6 shows a state of carrying out a further embodiment of the present invention.

A laser beam 42 is applied to a target 41, which contains components of an oxide superconductive material. A substrate 43 is arranged to be opposite to the target 41. When the laser beam 42 is applied to the target 41, particles are scattered in states of atoms and/or molecules from a position 44, which is irradiated with the laser beam 42, on the target 41. On the basis of such scattering of the particles, laser plasma is generated from the irradiated position 44 toward the substrate 43.

A gaseous oxygen conduit 45 is provided in the vicinity of the target 41, to spray gaseous oxygen around the position 44, irradiated with the laser beam 42, of the target 41, while a gaseous oxygen supply port 46, which is provided on a forward end of the gaseous oxygen conduit 45, is located in the vicinity of the irradiated position 44.

A ring-shaped electrode 47, for example, is arranged at a substantially intermediate position between the target 41 and the substrate 43. DC or RF power is applied to the electrode 47, whereby discharge plasma is generated around the electrode 47, to be superimposed on the aforementioned laser plasma.

Experimental Examples carried out on the basis of the embodiment shown in FIG. 6 are now described.

EXPERIMENTAL EXAMPLE 8

A $Y_1Ba_2Cu_3O_{7-\delta}$ sintered body was employed as a target 41. A KrF excimer laser 42 (wavelength: 248 nm) was converged to form a spot of 2 mm × 5 mm on the target 41. Energy density of the laser beam 42 at an irradiated position 44 of the target 41 was 2.5 J/cm². An MgO single-crystalline substrate 43 was employed, and its temperature was set at 450° C.

A gaseous oxygen conduit 45 of a metal tube having an inner diameter of 2 nun was arranged to locate its gaseous oxygen supply port 46 in a position separated by 1 mm from the irradiated position 44. Gaseous oxygen of 300 SCCM was blown out from the gaseous oxygen supply port 46, and the atmosphere pressure was set at 200 mTorr.

RF power of 13.56 MHz was applied to a ring-shaped electrode 47, to generate discharge plasma in the vicinity of the electrode 47.

The repetition rate of the laser beam 42 was set at 200 Hz, to form an oxide superconducting film on a substrate 43 at a film forming rate of 3.5 μm/min.

The as-formed oxide superconducting film exhibited a zero-resistance critical temperature of 85 K, and critical current density of $7.1 \times 10^5$ Å/cm² at 77.3 K.

For the purpose of comparison, another film was formed with no generation of discharge plasma at a film forming rate of 3.4 μm/min. The as-formed oxide superconducting film exhibited a critical temperature of 62 K. No critical current density was measured since it was impossible to measure the same at 77.3 K.

It is conceivable that no excellent superconductive properties were attained in the aforementioned comparative example particularly since its substrate 43 was at a low temperature of 450° C. For the purpose of reference, the temperature of such a substrate 43 was increased to 700° C. with no generation of discharge plasma, to form an oxide superconducting film. The as-formed film exhibited a critical temperature of 89 K, and critical current density of $1.7 \times 10^6$ Å/cm² at 77.3 K.

EXPERIMENTAL EXAMPLE 9

The pulse repetition rate (Hz) of a laser beam 42 was varied in a range of 10, 20, 30, 40 and 50, to form films with and without generation of discharge plasma respectively.

In the former case, a DC constant voltage source of +300 V was coupled to an electrode 47, to generate discharge plasma in the vicinity of the electrode 47.

Further, gaseous oxygen was blown out from a gaseous oxygen supply port 46 through a gaseous oxygen conduit 48, and a pumping speed was adjusted to attain a gas pressure of 200 mTorr in a vessel for laser ablation. The temperature of a substrate 43 was set at 400° C.

Other experimental conditions were similar to those in Experimental Example 8.

Table 4 shows film forming rates (/Å/min.), critical current density values $J_c$ (Å/cm²) at 77.3 K and zero-resistance critical temperatures $T_c$ (K) of the as-formed oxide superconducting films.

TABLE 4

| Repetition Rate | | 10 | 20 | 30 | 40 | 50 |
| --- | --- | --- | --- | --- | --- | --- |
| With Discharge Plasma | Film Forming Rate | 790 | 1620 | 2210 | 3210 | 4100 |
| | $J_c$ | $7.3 \times 10^5$ | $6.0 \times 10^5$ | $3.8 \times 10^5$ | $2.9 \times 10^5$ | $3.2 \times 10^5$ |
| | $T_c$ | 84.5 | 84.3 | 83.1 | 82.9 | 83.5 |
| With No Discharge Plasma | Film Forming Rate | 650 | 1790 | 2150 | 3300 | 4200 |
| | $J_c$ | $1.3 \times 10^2$ | $1.1 \times 10^2$ | — | — | — |
| | $T_c$ | 79.0 | 78.2 | 8.0 | <4.2 | <4.2 |

It is understood from Table 4 that, due to generation of the discharge plasma, excellent superconductive properties are still attained at such a low substrate temperature of 400° C., regardless of values of film forming rates. When no discharge plasma is generated, on the other hand, overall superconductive properties are relatively inferior, and gradually deteriorated particularly with increase of the film forming rate. At film forming rates exceeding 2000 Å/min., the comparative film, which was prepared with no generation of discharge plasma, exhibited extremely inferior or substantially no superconductive properties.

Thus, comparing the films particularly in relation to the film forming rates exceeding 2000 Å/min., it is understood that the inventive oxide superconducting film obtained with generation of discharge plasma exhibits extremely superior superconductive properties as compared with the comparative film obtained with no generation of discharge plasma, and this embodiment has a remarkable effect particularly under a high film forming rate.

EXPERIMENTAL EXAMPLE 10

A $Y_1Ba_2Cu_3O_{7-\delta}$ sintered body was employed as a target 41. An ArF excimer laser beam 42 (wavelength: 193 nm) was converged to form a spot of 3 × 6 mm² on the target 41. Energy density of the laser beam 42 at an irradiated position 44 of the target 41 was 1.2 J/cm². An MgO single-crystalline substrate 43 was employed, and its temperature was set at 500° C. Other conditions were similar to those in Experimental Example 8.

RF power was applied to an electrode 47 to generate discharge plasma, and gaseous oxygen was sprayed from a gaseous oxygen supply port 46 toward the irradiated position 44, to form an oxide superconducting film.

The as-formed film, which was obtained at a laser repetition rate of 2000 Hz and a film forming rate of 2.7 μm/min., exhibited a critical temperature of 84 K, and critical current density of $4.8 \times 10^5$ Å/cm² at 77.3 K.

For the purpose of comparison, another film was prepared with no generation of discharge plasma. This film exhibited no superconductivity at a temperature exceeding 4.2 K.

Although the present invention has been described and illustrated in detail, it is clearly understood that the same is by way of illustration and example only and is not to be taken by way of limitation, the scope of the present invention being limited only by the terms of the appended claims.

What is claimed is:

1. An apparatus for preparing an oxide superconducting film using laser ablation comprising:
    a target containing components of an oxide superconductive material;
    a laser source for applying a laser beam to said target;
    a substrate arranged to be opposite to said target; and
    a gaseous oxygen inlet in the vicinity of a point on said target irradiated by said laser beam, said inlet being directed toward and within a laser plasma generated by application of said laser beam to said target, said gaseous oxygen inlet being provided on a forward end of a conduit.

2. An apparatus for preparing an oxide superconducting film using laser ablation comprising:
    a target containing components of an oxide superconductive material;
    a laser source for applying a laser beam to said target;
    a substrate arranged to be opposite to said target;
    a tubular member enclosing and concentric with a laser plasma produced by applying said laser beam to said target; and
    a gaseous oxygen conduit joined to said tubular member and passing gaseous oxygen through said tubular member into an interior space defined by said tubular member.

3. An apparatus for preparing a superconducting film as described in claim 2, wherein said inlet is located at a substantially intermediate position along the axial length of said tubular member.

4. An apparatus for preparing a superconducting film as described in claim 2, wherein said tubular member has a plurality of holes provided on the inner peripheral surface of said tubular member, said holes communicating with said oxygen conduit and thereby conducting gaseous oxygen into the interior space defined by said tubular member.

* * * * *